(12) United States Patent
Poplack et al.

(10) Patent No.: US 8,160,862 B1
(45) Date of Patent: Apr. 17, 2012

(54) METHOD AND APPARATUS FOR CONTROLLING POWER IN AN EMULATION SYSTEM

(75) Inventors: Mitchell Grant Poplack, San Jose, CA (US); William F. Beausoleil, Hopewell Junction, NY (US); N. James Tomassetti, Kingston, NY (US); Tung-sun Tung, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 9 days.

(21) Appl. No.: 11/950,797

(22) Filed: Dec. 5, 2007

(51) Int. Cl.
*G06F 9/455* (2006.01)
*G06G 7/54* (2006.01)

(52) U.S. Cl. ............................................ 703/23; 703/18
(58) Field of Classification Search ..................... 703/23, 703/18
See application file for complete search history.

(56) References Cited

U.S. PATENT DOCUMENTS

| | | | |
|---|---|---|---|
| 5,673,420 A * | 9/1997 | Reyes et al. ........................ | 716/4 |
| 6,735,744 B2 * | 5/2004 | Raghunathan et al. ............ | 716/4 |
| 6,922,395 B1 * | 7/2005 | Elliott et al. .................... | 370/241 |
| 7,134,100 B2 * | 11/2006 | Ravi et al. ......................... | 716/2 |
| 7,174,468 B2 * | 2/2007 | Gary et al. ..................... | 713/300 |
| 7,496,788 B1 * | 2/2009 | Alfieri et al. ..................... | 714/21 |
| 7,555,422 B2 * | 6/2009 | Newman et al. ................ | 703/23 |
| 2007/0245278 A1 * | 10/2007 | Chen ................................. | 716/5 |
| 2008/0127001 A1 * | 5/2008 | Tamaki et al. .................... | 716/2 |

FOREIGN PATENT DOCUMENTS

| | | | |
|---|---|---|---|
| JP | 2005190237 A | * | 7/2005 |
| WO | WO 03/057432 A2 | * | 6/2003 |

OTHER PUBLICATIONS

Park et al, A Battery Emulator and Power-Profiling Instrument, Mar.-Apr. 2005, Design & Test of Computers, IEEE, pp. 150-159.*

\* cited by examiner

*Primary Examiner* — Dwin M Craig
*Assistant Examiner* — Aniss Chad
(74) *Attorney, Agent, or Firm* — Holland & Knight LLP; Brian J. Colandreo, Esq.; Mark H. Whittenberger, Esq.

(57) ABSTRACT

Method and apparatus for controlling power in an emulation system is described. In one example, power is controlled in a processor-based emulation system coupled to a host computer. A logic design is processed to identify unused resources in the emulation system during an emulation cycle. Power of the unused resources is controlled during emulation of a design under verification corresponding to the logic design by the emulation system. The resources may be identified as being unused during one or more steps of the emulation cycle. The power of the unused resources may be controlled by at least one of: powering down one or more of the unused resources; disabling one or more of the unused resources; freezing inputs to one or more of the unused resources; or setting inputs to one or more of the unused resources to a constant state. In this manner, power consumption of the emulation system is reduced.

18 Claims, 3 Drawing Sheets

METHOD AND APPARATUS FOR CONTROLLING POWER IN AN EMULATION SYSTEM

BACKGROUND OF THE INVENTION

1. Field of the Invention

Embodiments of the invention generally relate to circuit design emulation systems and, more specifically, to a method and apparatus for controlling power in an emulation system.

2. Description of the Related Art

Hardware based functional design verification systems, often referred to as emulators or simulation accelerators, are devices that allow functional verification of a user's logic design prior to fabrication of the design into an integrated circuit (IC). The logic design at this stage is often referred to as the design under tests, (DUT), or design under verification (DUV). Because it is very expensive and time consuming to fabricate a design into silicon, it is desirable to use an emulator to debug the logic to remove functional errors prior to fabrication. Design verification systems allow chip designers to test and debug their design prior to incurring the cost and time of fabrication. Once a user's design is functionally verified, it is then possible to use the emulator to design and test other features of the system. These emulators have thus become quite heavily relied upon in the IC design industry.

Some emulation systems contain an interconnected array of emulation processors. Each emulation processor can be programmed to evaluate logic functions. The program-driven processors operate together as an interconnected unit, emulating an entire desired logic design. Such emulation systems are available from various vendors, including Cadence Design Systems, Inc., San Jose, Calif., among others.

As integrated circuit designs grow in size, more emulation processors are required to accomplish the emulation task. Due to the increasing number of emulation processors, the power and cooling requirements of processor-based emulation systems are relatively high. Historically, this has meant that users of such systems must provide users, where the requirements of such specialized equipment are onerous. As such, there is a need in the art to control power in an emulation system.

SUMMARY OF THE INVENTION

Method and apparatus for controlling power in an emulation system is described. One aspect of the invention relates to controlling power in a processor-based emulation system coupled to a host computer. A logic design is processed to identify unused resources in the emulation system during an emulation cycle. Power of the unused resources is controlled during emulation of a design under verification corresponding to the logic design by the emulation system. The resources may be identified as being unused during one or more steps of the emulation cycle. The power of the unused resources may be controlled by at least one of: powering down one or more of the unused resources; disabling one or more of the unused resources; freezing inputs to one or more of the unused resources; or setting inputs to one or more of the unused resources to a constant state. In this manner, power consumption of the emulation system is reduced.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
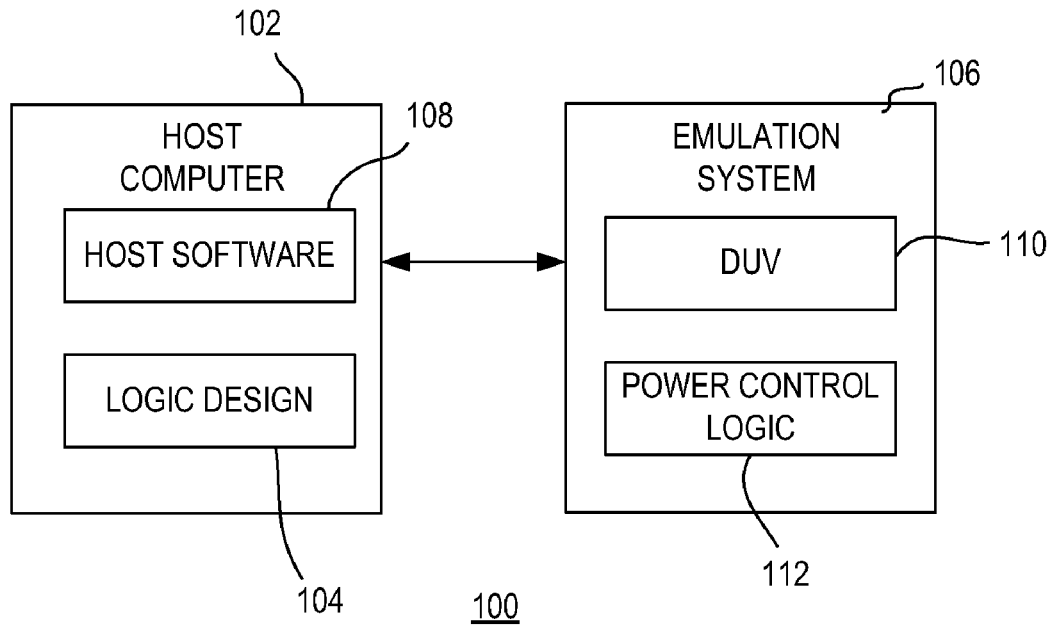
FIG. 1 is a block diagram depicting an exemplary embodiment of logic verification system in accordance with one or more aspects of the invention.

FIG. 1 is a block diagram depicting an exemplary embodiment of logic verification system 100 in accordance with one or more aspects of the invention. The system 100 includes a computer system 102 coupled to an emulation system 106. The computer system 102 executes host software 108, which may provide one or more functions. Notably, the host software 108 is configured to translate a description of a logic design to be verified ("logic design 104") into a plurality of statements, known as emulation steps ("steps"). The steps are loaded into the emulation system 106 to establish a design under verification (DUV) 110. That is, the host software 108 configures the emulation system 106 to emulate the DUV 110, which conforms to the logic design 104. The emulation system 106 performs the verification process by executing the steps. A complete execution of the steps is referred to as an emulation cycle. An emulation cycle typically provides a complete modeling of the logic design 104. The host software 108 may also capture data from the emulation system 106 for the purposes of monitoring and analyzing results of one or more emulation cycles.

Figure 2:
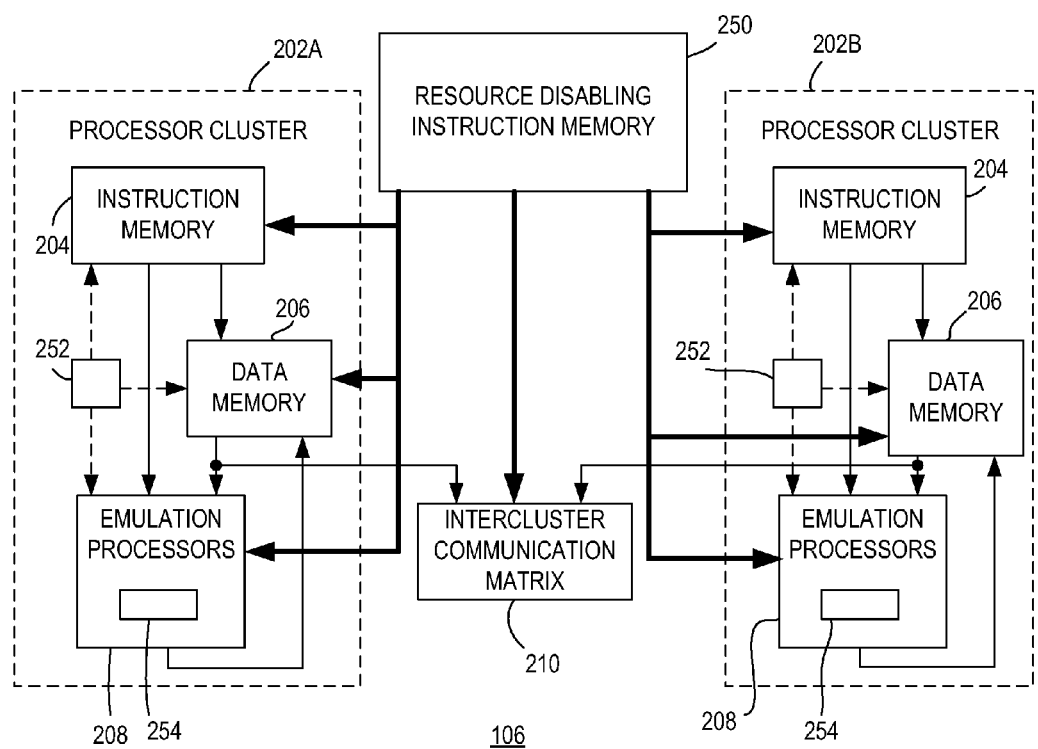
FIG. 2 is a block diagram depicting an exemplary embodiment of the emulation system in accordance with one or more aspects of the invention.

FIG. 2 is a block diagram depicting an exemplary embodiment of the emulation system 106 in accordance with one or more aspects of the invention. The emulation system 106 includes a plurality of processor clusters 202. In the present example, two processor clusters designated 202A and 202B are shown by way of example. It is to be understood that a commercial emulation system typically includes more than two processor clusters. Each of the processor clusters 202A and 202B includes an instruction memory 204, a data memory 206, and a plurality of emulation processors 208. The emulation processors 208 are configured to share the instruction and data memories 204 and 206.

Notably, the instruction memory 204 is configured to store instructions to be executed by the emulation processors 208 to implement the steps of an emulation cycle. The emulation processors 208 are coupled to the instruction memory 204 to obtain and execute the instructions. The data memory 206 is configured to store input and output data for the emulation processors 208. The emulation processors 208 are coupled to the data memory 206 to read input data from the data memory 206, and store output data to the data memory 206. The instruction memory 204 may be coupled to the data memory 206 for the purposes of storing data to the data memory 206.

The processor clusters 202 are configured to communicate among each other using an intercluster communication matrix 210. In the present example, the intercluster communication matrix 210 is configured to read data from the data memory 206 in each of the processor clusters 202A and 202B. In this manner, output data from the emulation processors 208 in the processor cluster 202A can be stored in the data memory 206 of the processor cluster 202B for use as input data for the emulation processors 208 of the processor cluster 202B. In general, the intercluster communication matrix 210 enables communication of data between the emulation processors of different processor clusters.

With reference to FIGS. 1 and 2, in accordance with one aspect of the invention, the emulation system 106 further includes power control logic 112. The power control logic 112 reduces power consumption by resources in the emulation system 106. Resources in the emulation system 106 include, for example, processor clusters 202, the intercluster communication matrix 210, as well as devices in each processor cluster 202, such as the instruction memory 204, the data memory 206, and the emulation processors 208. Those skilled in the art will appreciate that the emulation system 106 shown in FIG. 2 is simplified and that an actual emulation system may include various other components, such as different memories, input/output (I/O) circuitry, control circuitry, and the like. It is to be understood that the term "resources," as used herein, generally encompasses components used in an emulation system that are capable of being controlled to reduce power consumption. In some embodiments, a resource is "controlled" to reduce power by initiating one or more of the following actions: powering down the resource; logically disabling the resource; freezing inputs to the resource; or setting inputs to one or more of the unused resources to a constant state. The constant state may be selected such that the resource consumes less power than if the inputs were left uncontrolled.

Furthermore, the elements shown in FIG. 2 are logical in nature and may be physically implemented in various ways. For example, the emulation processors 208 may be physically implemented using one or more processor integrated circuits (ICs). That is, a processor IC may include one or more of the emulation processors 208. In another example, the instruction memory 204, the data memory 206, or both may be implemented using one or more memory ICs. The term "resources" is also meant to encompass such physical ICs. Thus, a processor IC, a memory IC, or other type of IC implementing resources may be controlled to reduce power using the mechanisms described above.

In some embodiments, the power control logic 112 reduces power consumption by controlling unused resources. A resource is "unused" if that resource is not required in the performance of a given step or sequence of steps in an emulation cycle. Notably, a given resource may only be unused for a portion of a given emulation cycle. Other resources may be unused for an entire emulation cycle. The power control logic 112 may reduce power consumption of unused resources in static, pseudo-dynamic, or dynamic fashion.

In some embodiments, the power control logic 112 provides static control of unused resources to reduce power consumption. For example, the power control logic 112 may control those resources that are unused for an entire emulation cycle. Such unused resources may be controlled (e.g., powered down, disabled, etc.) prior to initiating an emulation cycle and throughout the emulation cycle.

In some embodiments, the power control logic 112 provides dynamic control of unused resources to reduce power consumption. The power control logic 112 may control unused resources on a step-by-step basis during the emulation cycle. For example, a given resource may not be required during the performance of one or more steps of the emulation cycle. For example, an emulation processor may not have any instructions to perform during the performance of one or more steps. In such case, the power control logic 112 may dynamically control that emulation processor during those step(s) where the emulation processor is unused. If the given processor is used again later during the emulation cycle, the power control logic 112 will ceases power control thereof. That is, the power control logic 112 only provides power control of a given resource for particular designated steps of the emulation cycle. In this manner, the power control logic 112 provides dynamic power control of individual resources on a step-by-step basis during an emulation cycle.

In some embodiments, the power control logic 112 provides pseudo-dynamic control of unused resources to reduce power consumption. The power control logic 112 may control unused resources after a particular step during the emulation cycle. Such unused resources will remain in the power controlled state for the remainder of the emulation cycle. Such pseudo-dynamic control provides for less control than the dynamic control discussed above. However, the pseudo-dynamic control is less expensive in terms of processing in that decision to power-control the resources is not analyzed after each step in the emulation cycle. In some embodiments, a combination of static, dynamic, and pseudo-dynamic power control is employed.

In some embodiments, the power control logic 112 comprises a power control instruction memory 250. The power control instruction memory 250 is configured to store instructions that enable power control of the resources in the emulation system 106. The power control instructions implemented in parallel across the controlled resources. The power control instruction memory 250 provides control signals to resources in the emulation system 106, including the processor cluster 202A, the intercluster communication matrix 210, and the processor cluster 202B. Within a processor cluster, the power control instruction memory 250 provides control signals to the instruction memory 204, the data memory 206, and the emulation processors 208. The instructions are configured to implement the static, dynamic, and/or pseudo-dynamic power control of unused resources, as described above.

For example, some instructions may power control particular resources (e.g., power down, disable, etc.) for the entire emulation cycle (i.e., static control). Some instructions may power control resources on a step-by-step basis. That is, the power control instruction memory 250 may store a sequence of instructions for a given resource that implement power control when the resource is unused, namely, during the steps in the emulation cycle when the resource is not required. Some instructions may control resources after (or before) occurrence of a particular step in the emulation cycle. For example, a particular resource may be used for only the first 90 of 100 steps in an emulation cycle. After the $90^{th}$ step, an instruction in the power control instruction memory 250 power controls the resource by disabling the resource, powering down the resource, or the like.

In other embodiments, the power control logic 112 is more distributed throughout the emulation system 106. For example, each of the processor clusters 202 may include a power control instruction memory 252 that controls the resources therein. In another embodiment, resources that are desired to be power controlled include a configuration register that can be loaded with one or more instructions to implement the above-described power control. For example, each of the emulation processors 208 may include configuration register(s) 254 capable of storing instruction(s) that dictate when during the emulation cycle the processors should be power controlled. The power control mechanism is similar to the centralized power control instruction memory, except that the memory is pushed further down and distributed among the hierarchy of resources.

Figure 3:
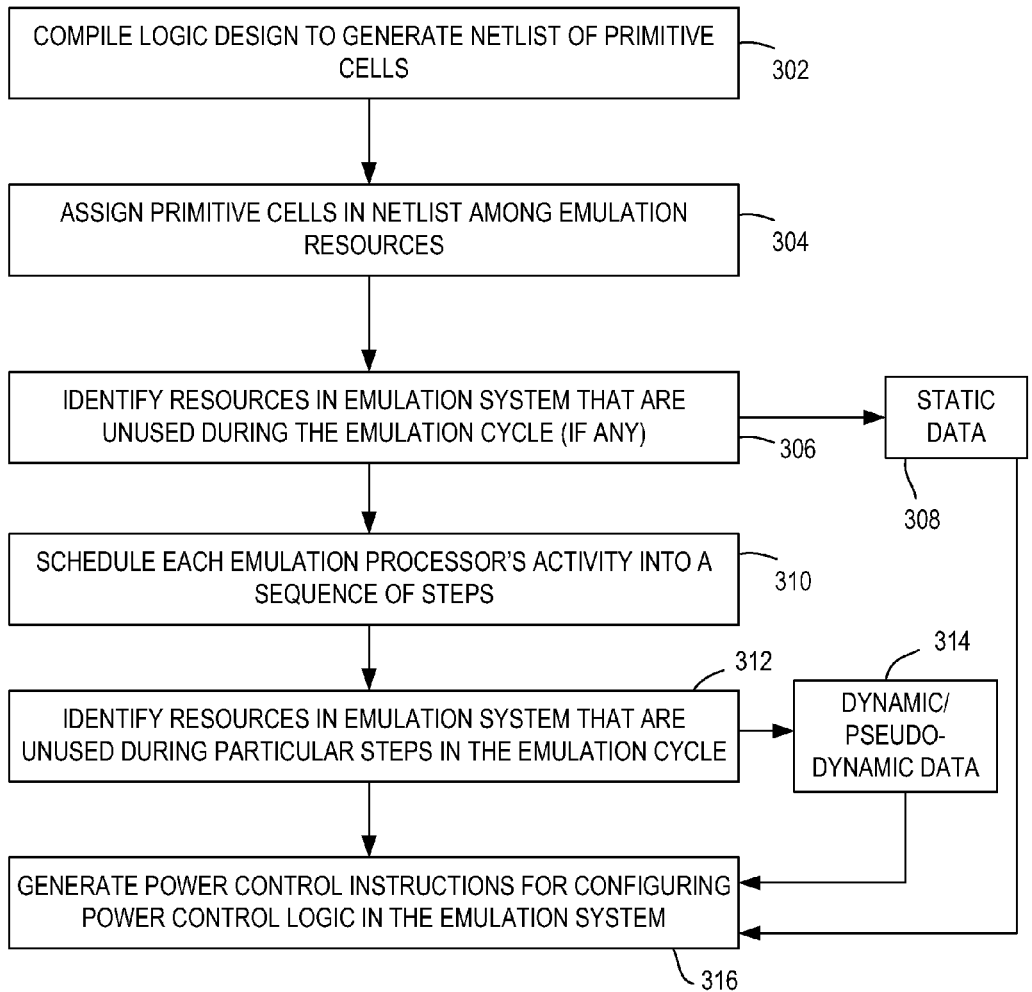
FIG. 3 is a flow diagram depicting an exemplary embodiment of a method for translating a logic design for emulation in accordance with one or more aspects of the invention.

The determination of which resources are unused may be made during translation of the logic design 104 by the host software 108. FIG. 3 is a flow diagram depicting an exemplary embodiment of a method 300 for translating a logic design for emulation in accordance with one or more aspects of the invention. The method 300 may be performed by the host software 108 of the host computer 102 and may be understood with reference to FIGS. 1 and 2. The method 300 begins at block 302, where the logic design 104 is compiled to generate a netlist of primitive cells. For example, the logic design may comprise a register transfer level (RTL) description, such as a hardware description language (HDL) description. The RTL description may then be synthesized, as is well known in the art, to generate the netlist. The netlist is a logical description of the logic design's components and electrical interconnections. The netlist includes primitive cells necessary for implementing the logic design 104, such as combinatorial logic (e.g., gates), sequential logic (e.g., flip-flops and latches), memory (SRAM, DRAM, etc.), and the like.

At block 304, the primitive cells of the netlist are assigned among the emulation resources in the emulation system 106 (e.g., among the processor clusters 202, emulation processors 208, etc.). At block 306, the resources in the emulation system 106 that are unused during the emulation cycle are identified, if any. For example, the logic design 104 may be of a size that does not require use of all of the processor clusters 202 and/or emulation processors 208 in the emulation system 106 for an entire emulation cycle. As described above, these unused resources are subject to static power control. Thus, static data 308 results from execution of block 306. The static data 308 is indicative of which emulation resources are unused during the emulation cycle.

At block 310, each emulation processor's activity is scheduled into a sequence of instructions. As described above, an emulation cycle comprises a sequence of steps. Some of the emulation processors may execute an instruction for each step in the emulation cycle. Other emulation processors may only execute instructions for some of the steps in the emulation cycle. In an emulation processor, non-execution of an instruction may take the form of execution of a no-operation (NOP) instruction. At block 312, emulation resources that are unused during particular steps of the emulation cycle are identified, if any. For example, a particular emulation processor may not be required during steps 50-60 of a given emulation cycle comprising 100 steps. As described above, such an emulation processor is subject to dynamic power control during steps 50-60 of the emulation cycle. In another example, a particular emulation processor may not be required after (or before) step 50 of a given emulation cycle comprising 100 steps. As described above, such an emulation processor is subject to pseudo-dynamic power control after (or before) step 50. Thus, dynamic/pseudo-dynamic data 314 results from execution of block 312. The dynamic/pseudo-dynamic data 314 is indicative of which emulation resources are unused during which steps of the emulation cycle.

At block 316, power control instructions are generated for configuring the power control logic 112 in the emulation system 106. The power control instructions are generated from the static data 308 and the dynamic/pseudo-dynamic data 314. The power control instructions may be loaded into a centralized power control instruction memory (e.g., the memory 250) or into a distributed power control instruction memory (e.g., configuration registers in the resources). Static or pseudo-dynamic power control may require only a single instruction for a given resource. For example, an instruction that implements power control of a resource for the entire emulation cycle or emulation step(s) before or after a particular threshold step. Dynamic power control requires a sequence of instructions that correspond to the steps in the emulation cycle (e.g., 100 steps having 100 power control instructions for a given resource).

Operation of the power control process described herein may be understood with reference to the following non-limiting example. Assume the emulation processors 208 in the cluster 202A are scheduled to execute instructions for the first 90 steps of a 100 step emulation cycle. For the last 10 steps, the emulation processors 208 are unused such that the emulation processors 208 are scheduled to execute NOP instructions. Execution of a NOP instruction requires an emulation processor to access the instruction memory 204 to retrieve the instruction. Execution of the NOP instruction may generate some data (which will be ignored) to be stored in the data memory 206. Such memory accesses consume power unnecessarily. Thus, in accordance with aspects of the invention discussed above, the emulation processors 208 in the cluster 202A are identified as being unused after step 90 of the emulation cycle. A power control instruction is generated that will power control the emulation processors after occurrence of step 90 in the emulation cycle. The power control may take the form of disabling or otherwise preventing the emulation processors 208 from accessing the instruction and data memories 204 and 206 after step 90 of the emulation cycle. Thus, power consumption by the emulation system 106 during the emulation cycle is reduced.

Figure 4:
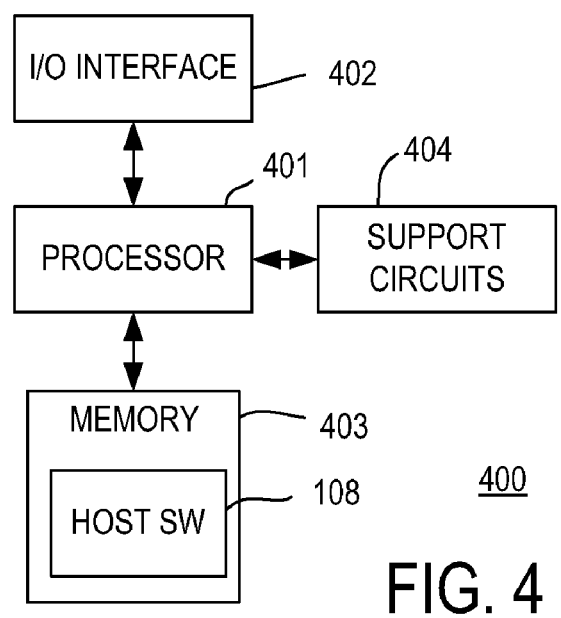
FIG. 4 is a block diagram depicting an exemplary embodiment of a computer system in accordance with one or more aspects of the invention.

FIG. 4 is a block diagram depicting an exemplary embodiment of a computer system 400 in accordance with one or more aspects of the invention. The computer system 400 may be used to implement the host computer 102. The computer system 400 includes a processor 401, a memory 403, various support circuits 404, and an I/O interface 402. The processor 401 may include one or more microprocessors known in the art. The support circuits 404 for the processor 401 include conventional cache, power supplies, clock circuits, data registers, I/O interfaces, and the like. The I/O interface 402 may be directly coupled to the memory 403 or coupled through the processor 401. The I/O interface 402 may also be configured for communication with the emulation system 106.

The memory 403 stores processor-executable instructions and/or data that may be executed by and/or used by the processor 401. These processor-executable instructions may comprise hardware, firmware, software, and the like, or some combination thereof. A module having processor-executable instructions that are stored in the memory 403 may include the host software 108. The memory 403 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii)

information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to embodiments of the present invention, other and further embodiments of the invention may be devised without departing from the basic scope thereof, and the scope thereof is determined by the claims that follow.

What is claimed is:

1. A method of controlling power in an emulation system coupled to a host computer system, comprising:
   processing a logic design using the host computer system to identify unused resources in the emulation system during an emulation cycle, each of the unused resources being a resource in the emulation system that is not required in the performance of one or more steps of the emulation cycle;
   controlling power of the unused resources during emulation of a design under verification corresponding to the logic design by the emulation system;
   wherein the emulation system comprises a plurality of processor clusters coupled to an intercluster communication matrix; and
   storing instructions for controlling power of the unused resources in a power control instruction memory, the power control instruction memory coupled to each of the plurality of processor clusters and the intercluster communication matrix.

2. The method of claim 1, further comprising:
   generating instructions for controlling power of the unused resources; and
   loading the instructions into power control instruction memory in the emulation system.

3. The method of claim 2, wherein at least one of the unused resources is associated with only one of the instructions.

4. The method of claim 2, wherein at least one of the unused resources is associated with a sequence of the instructions.

5. The method of claim 1, wherein the act of processing comprises:
   identifying at least one of the unused resources as being unused during each of a sequence of steps of the emulation cycle;
   wherein the power of the at least one unused resource is controlled during each of the sequence of steps.

6. The method of claim 1, wherein the act of processing comprises:
   identifying at least one of the unused resources as being unused during one or more steps of a sequence of steps of the emulation cycle.

7. The method of claim 6, wherein the power of the at least one unused resource is controlled only during the one or more steps of the emulation cycle.

8. The method of claim 6, wherein the power of the at least one unused resource is controlled after or before a threshold step in the sequence of steps.

9. The method of claim 1, wherein the power of the unused resources is controlled by at least one of:
   powering down one or more of the unused resources;
   disabling one or more of the unused resources; freezing inputs to one or more of the unused resources; or setting inputs to one or more of the unused resources to a constant state.

10. The method of claim 1, wherein at least a portion of the unused resources comprise emulation processors.

11. Apparatus for controlling power in an emulation system coupled to a host computer system, comprising:
    power control logic, disposed in the emulation system, configured to obtain information indicative of unused resources in the emulation system during an emulation cycle for a logic design, each of the unused resources being a resource in the emulation system that is not required in the performance of one or more steps of the emulation cycle, the power control logic further configured to control power of the unused resources during emulation of a design under verification corresponding to the logic design by the emulation system;
    wherein the emulation system comprises a plurality of processor clusters coupled to an intercluster communication matrix, and
    wherein the power control logic comprises a power control instruction memory coupled to each of the plurality of processor clusters and the intercluster communication matrix, the power control instruction memory configured to store instructions for controlling power of the unused resources.

12. The apparatus of claim 11, wherein each of the plurality of processor clusters includes an instruction memory, a data memory, and emulation processors, and
    wherein the power control instruction memory is configured to provide control signals to the instruction memory, the data memory, and the emulation processors in each of the plurality of processor clusters.

13. The apparatus of claim 11, wherein the emulation system comprises a plurality of processor clusters coupled to an intercluster communication matrix, and
    wherein the power control logic comprises a power control instruction memory disposed in each of the plurality of processor clusters.

14. The apparatus of claim 11, wherein the emulation system comprises a plurality of processor clusters coupled to an intercluster communication matrix,
    wherein each of the plurality of processor clusters includes emulation processors, and
    wherein the power control logic comprises configuration registers in the emulation processors of each of the plurality of processor clusters.

15. A logic design verification system, comprising:
    an emulation system configured to emulate a design under verification corresponding to a logic design during an emulation cycle having a sequence of steps, wherein the emulation system comprises a plurality of processor clusters coupled to an intercluster communication matrix;
    a host computer system having host software configured to process the logic design to identify unused resources in the emulation system during the emulation cycle, each of the unused resources being a resource in the emulation system that is not required in the performance of one or more steps of the emulation cycle; and
    power control logic configured to control power of the unused resources during emulation of the design under verification by the emulation system;
    wherein the power control logic comprises a power control instruction memory coupled to each of the plurality of processor clusters and the intercluster communication matrix, the power control instruction memory configured to store instructions for controlling power of the unused resources.

16. The system of claim 15, wherein the host software is configured to generate instructions for controlling power of the unused resources, and wherein the power control logic includes power control instruction memory configured to store the instructions.

17. The system of claim 16, wherein each of the unused resources is associated with one or more of the instructions.

18. The system of claim 15 wherein the power control logic is configured to control power of the unused resources by at least one of: powering down one or more of the unused resources; disabling one or more of the unused resources; freezing inputs to one or more of the unused resources; or setting inputs to one or more of the unused resources to a constant state.

* * * * *